(12) United States Patent
Babich et al.

(10) Patent No.: US 7,651,947 B2
(45) Date of Patent: Jan. 26, 2010

(54) MASK FORMING AND IMPLANTING METHODS USING IMPLANT STOPPING LAYER AND MASK SO FORMED

(75) Inventors: Katherina Babich, Chappaqua, NY (US); Todd C. Bailey, Poughkeepsie, NY (US); Richard A. Conti, Katonach, NY (US); Ryan P. Deschner, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 15 days.

(21) Appl. No.: 11/420,321

(22) Filed: May 25, 2006

(65) Prior Publication Data

US 2007/0275563 A1   Nov. 29, 2007

(51) Int. Cl.
*H01L 21/302* (2006.01)
(52) U.S. Cl. .................. 438/705; 438/712; 438/717; 438/736
(58) Field of Classification Search .............. 438/705, 438/712, 717, 736
See application file for complete search history.

(56) References Cited

U.S. PATENT DOCUMENTS

| | | | |
|---|---|---|---|
| 5,795,810 A | 8/1998 | Houston | |
| 6,881,638 B1 | 4/2005 | Gau | |
| 7,422,966 B2 * | 9/2008 | Forbes et al. ............... | 438/483 |
| 2002/0012876 A1 * | 1/2002 | Angelopoulos et al. .. | 430/271.1 |
| 2004/0188684 A1 | 9/2004 | Glass et al. | |
| 2006/0063338 A1 * | 3/2006 | Menon et al. ............... | 438/296 |
| 2006/0063376 A1 * | 3/2006 | Lee et al. ..................... | 438/638 |

FOREIGN PATENT DOCUMENTS

CN   1514472   7/2004

OTHER PUBLICATIONS

Babich et al., U.S. Appl. No. 12/145,922, Response To Office Action dated Mar. 11, 2009, filed Jun. 11, 2009.
U.S. Appl. No. 12/145, 922, Office Action dated Mar. 11, 2009.

\* cited by examiner

*Primary Examiner*—Binh X Tran
(74) *Attorney, Agent, or Firm*—Wenjie Li; Hoffman Warnick LLC

(57) ABSTRACT

Methods of forming a mask for implanting a substrate and implanting using an implant stopping layer with a photoresist provide lower aspect ratio masks that cause minimal damage to trench isolations in the substrate during removal of the mask. In one embodiment, a method of forming a mask includes: depositing an implant stopping layer over the substrate; depositing a photoresist over the implant stopping layer, the implant stopping layer having a density greater than the photoresist; forming a pattern in the photoresist by removing a portion of the photoresist to expose the implant stopping layer; and transferring the pattern into the implant stopping layer by etching to form the mask. The implant stopping layer may include: hydrogenated germanium carbide, nitrogenated germanium carbide, fluorinated germanium carbide, and/or amorphous germanium carbon hydride (GeHX), where X includes carbon. The methods/mask reduce scattering during implanting because the mask has higher density than conventional masks.

17 Claims, 6 Drawing Sheets

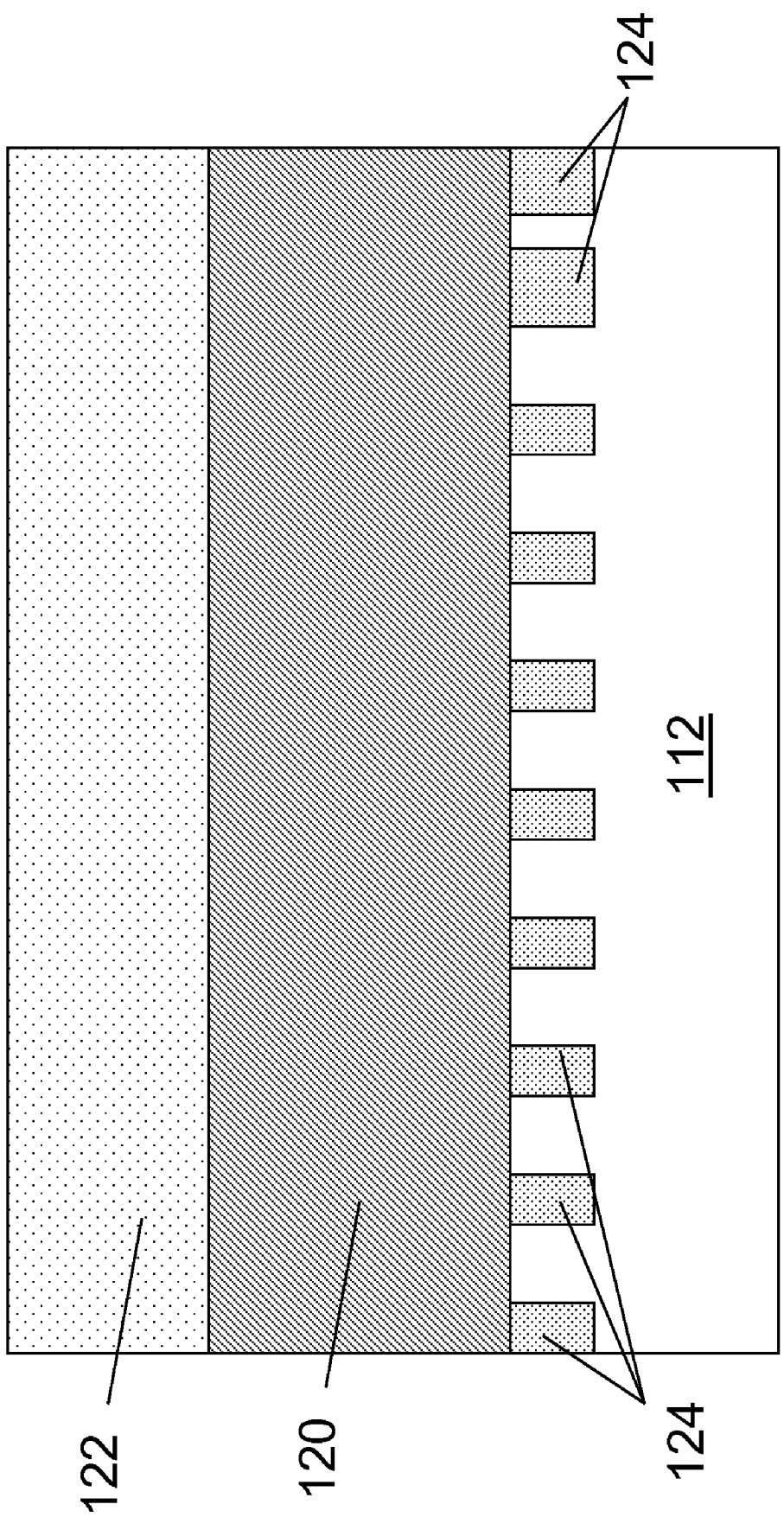

MASK FORMING AND IMPLANTING METHODS USING IMPLANT STOPPING LAYER AND MASK SO FORMED

BACKGROUND OF THE INVENTION

1. Technical Field

The invention relates generally to semiconductor device fabrication, and more particularly, to a method for forming a mask for implanting a substrate, where the mask includes an implant stopping layer, and a mask so formed.

2. Background Art

In the semiconductor fabrication industry continual miniaturization of structures presents challenges relative to modifying current techniques. One challenge is addressing problems related to photolithography. Photolithography is a process used in the semiconductor fabrication industry in which a photo-sensitive material, i.e., a photoresist, is laid upon a substrate, imaged and then etched to leave a pattern that can be used to generate other structures within the substrate. As miniaturization continues, the dimensions of patterned photoresists are also being minimized. Some processing, for example, deep well ion implants, require very thick layers of photoresist to block ion implantation into areas under the photoresist in which the implantation is not desired. These patterned single layer photoresists have a relatively high aspect ratio, i.e., patterned photoresist height to patterned line width, and, as a result, are subject to collapse. For example, FIG. 1 shows a conventional patterned photoresist 10 over a substrate 12 having trench isolations 14 therein. Patterned photoresist 10 has a relatively high aspect ratio. As shown in FIG. 2, patterned photoresist 10 is subject to capillary-induced line collapses in which capillary action within patterned openings 16 (FIG. 1) draws the photoresist inwardly and causes a collapse.

One approach to address this situation has been to employ hard masks having two layers, one layer including silicon oxide and/or silicon nitride to block the ion implantation. While bilayer photoresist masks have lower aspect ratios compared to single layer masks, during removal of these bilayer masks, trench isolations 14 (FIG. 2) within substrate 12, which typically include silicon oxide and/or silicon nitride based materials, can be degraded because the etching chemistry used to remove the hard mask is also effective on the trench isolation. In addition, these conventional bilayer photoresist masks must be inorganic, which prevents use of a wide variety of organic photoresists. In addition, the total density of the photoresist mask leads to ion scattering, which causes proximity effects in neighboring devices.

In view of the foregoing, there is a need in the art for a solution to the problems of the related art.

SUMMARY OF THE INVENTION

Methods of forming a mask for implanting a substrate and implanting using an implant stopping layer with a photoresist provide lower aspect ratio masks that cause minimal damage to trench isolations in the substrate during removal of the mask. In one embodiment, a method of forming a mask includes: depositing an implant stopping layer over the substrate; depositing a photoresist over the implant stopping layer, the implant stopping layer having a density greater than the photoresist; forming a pattern in the photoresist by removing a portion of the photoresist to expose the implant stopping layer; and transferring the pattern into the implant stopping layer by etching to form the mask. The implant stopping layer may include: hydrogenated germanium carbide, nitrogenated germanium carbide, fluorinated germanium carbide, and/or amorphous germanium carbon hydride (GeHX), where X includes carbon. The methods/mask reduce scattering during implanting because the mask has higher density than conventional masks.

A first aspect of the invention provides a method of forming a mask for implanting a substrate, the method comprising the steps of: depositing an implant stopping layer over the substrate; depositing a photoresist over the implant stopping layer, the implant stopping layer having a density greater than the photoresist; forming a pattern in the photoresist by removing a portion of the photoresist to expose the implant stopping layer; and transferring the pattern into the implant stopping layer by etching to form the mask.

A second aspect of the invention provides a mask comprising: an implant stopping layer over a substrate, wherein the implant stopping layer includes at least one of hydrogenated germanium carbide, nitrogenated germanium carbide, fluorinated germanium carbide and amorphous germanium carbon hydride (GeHX), where X includes carbon; and a photoresist over the implant stopping layer.

A third aspect of the invention provides a method of implanting a substrate, the method comprising the steps of: depositing an implant stopping layer over the substrate, wherein the implant stopping layer includes at least one of: hydrogenated germanium carbide, nitrogenated germanium carbide, fluorinated germanium carbide, and amorphous germanium carbon hydride (GeHX), where X includes carbon; depositing a photoresist over the implant stopping layer, the implant stopping layer having a density greater than the photoresist; forming a pattern in the photoresist by removing a portion of the photoresist to expose the implant stopping layer; transferring the pattern into the implant stopping layer by etching to form the mask; and implanting the substrate.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIGS. 3-5 show steps of a method of forming a mask according to one embodiment of the invention.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 2:
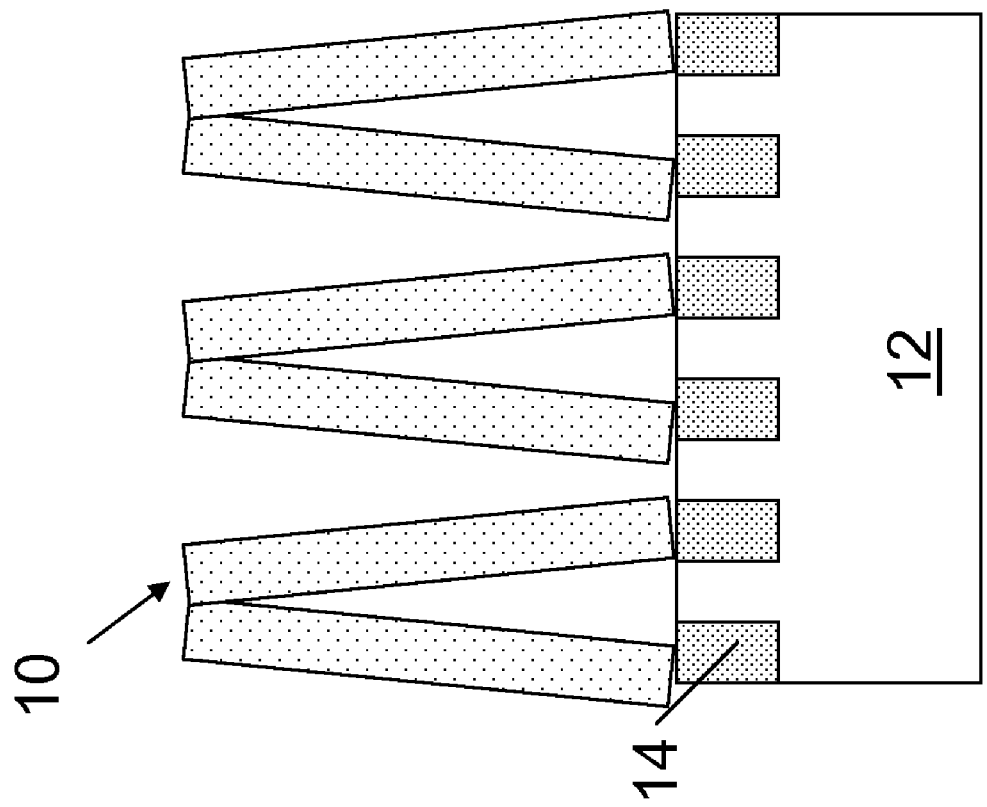
FIGS. 1 and 2 show a conventional photoresist mask.
Figure 1:
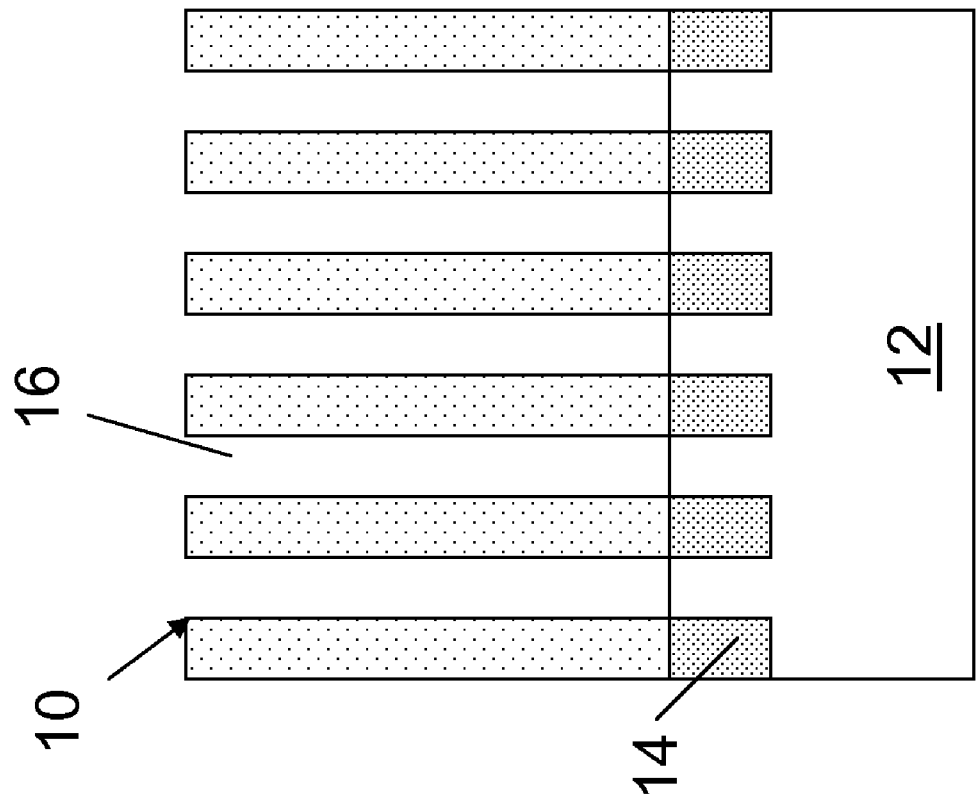
Figure 4:
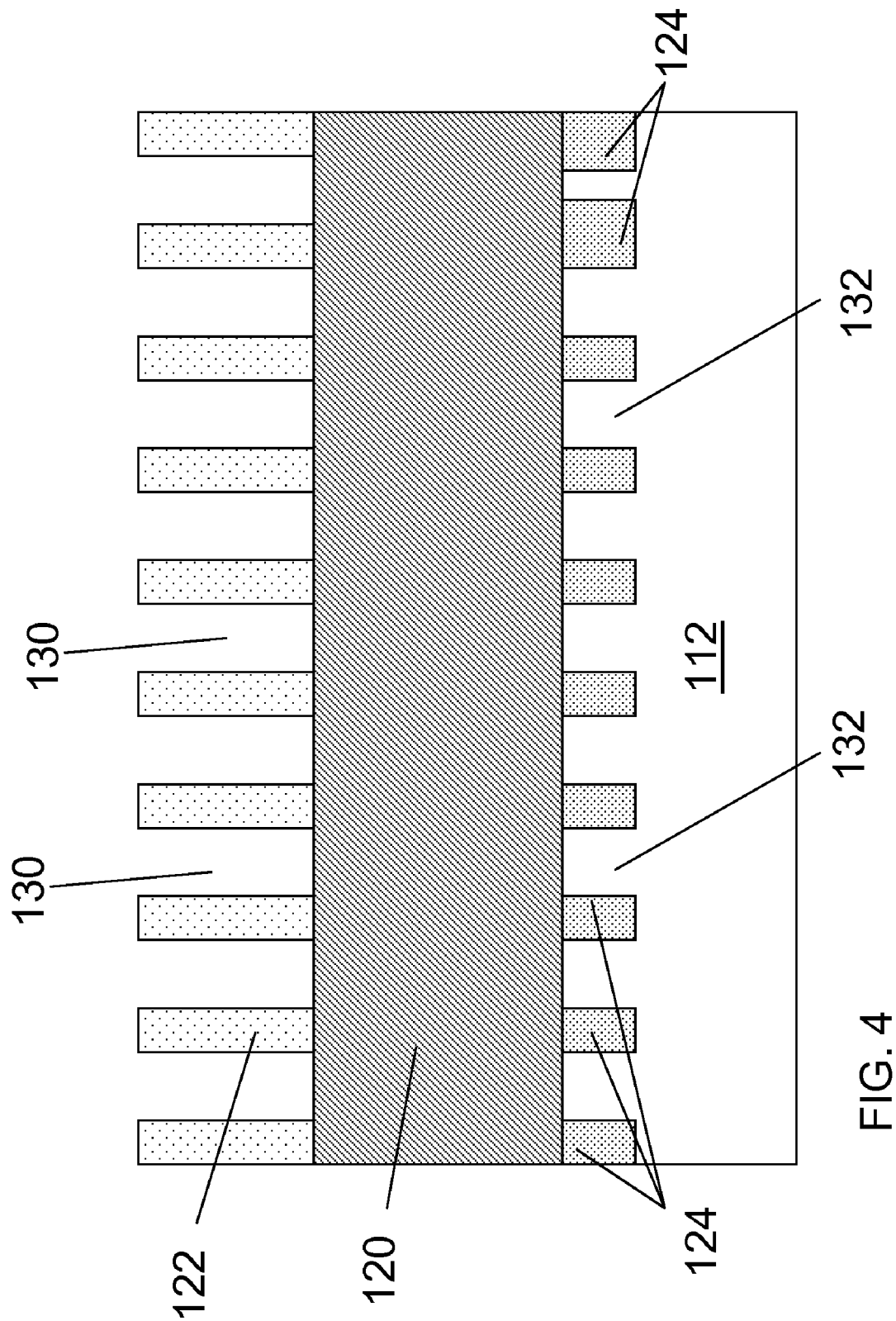
Figure 5:
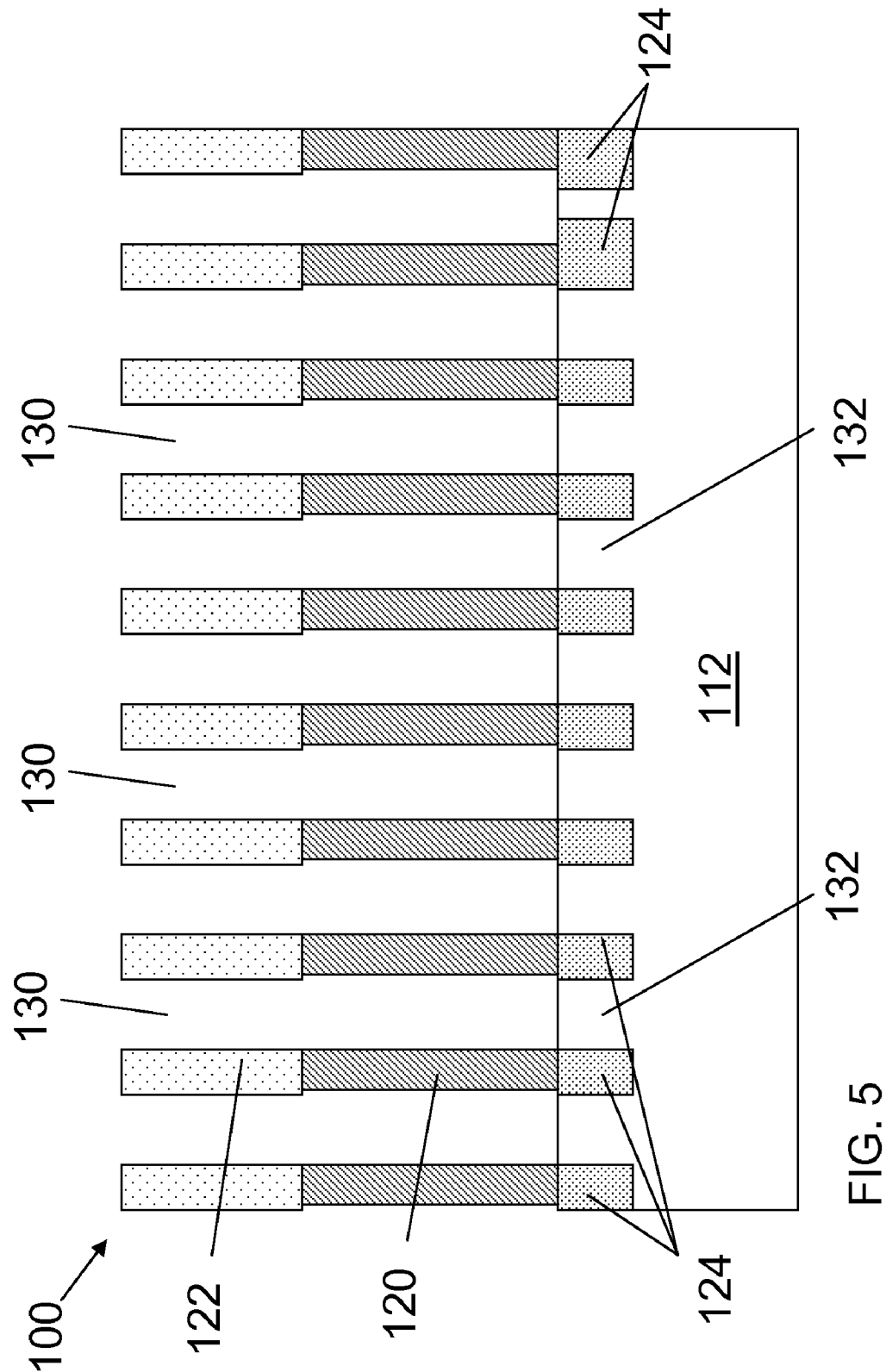

Turning to FIGS. 3-5, one embodiment of a method of forming a mask 100 (FIG. 5) for implanting a substrate 112 is illustrated. As shown in FIG. 3, a first step includes depositing an implant stopping layer 120 over substrate 112, followed by deposition of a photoresist 122 over implant stopping layer 120. Each layer may be deposited using any now known or later developed process. In one embodiment, however, ion implant stopping layer 120 is deposited by at least one of:

chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), sputtering deposition, ion beam deposition, electron beam deposition, and laser assisted deposition. Implant stopping layer 120 may have a depth that is greater than a depth of photoresist 122. Substrate 112 may include any now known or later developed substrate material such as one or more of the following: a semiconductor (e.g., silicon, silicon germanium (SiGe), a dielectric, a glass, a metal, nonmetallic conductor, magnetic material and a polymer. In addition, substrate 112 may include trench isolations 124 of, for example, silicon oxide, for electrically separating devices to be generated on substrate 112.

Implant stopping layer 120 has a density sufficient to stop ion implanting from reaching substrate 112, as will be described in greater detail below. That is, implant stopping layer 120 has a density greater than photoresist 122. Hence, implant stopping layer 120 is not used as a conventional bilayer masking process because its higher density allows for thinning of the stack compared to conventional bilayer or single resist schemes. In one embodiment, implant stopping layer 120 includes at least one of the following: hydrogenated germanium carbide, nitrogenated germanium carbide, fluorinated germanium carbide, and amorphous germanium carbon hydride (GeHX), where X includes carbon. Implant stopping layer 120 may be deposited from a precursor including, for example, at least one of: germane, alkyl germane, alkoxy germane, acyloxy germane, aryl germane, cyclicgermanes, nitrogen, carbon, and fluorine. In one embodiment, implant stopping layer 120 may be deposited from tetramethylgermane in a reactor at a pressure of approximately 0.1 Torr to approximately 50 Torr, and substrate 112 at a temperature of approximately 200° C. to approximately 500° C. In an alternative embodiment, implant stopping layer 120 may be deposited from germane in the presence of ethylene and/or acetylene in a reactor at a pressure of approximately 0.1 Torr to approximately 50 Torr, and substrate 112 at a temperature of approximately 200° C. to approximately 500° C. Other techniques may also be employed.

Photoresist 122 may include inorganic photoresist material or organic photoresist material, i.e., including carbon (C). In any event, photoresist 122 is photosensitive to, for example, i-line, g-line, 248 nm, 193 nm, 157 nm, 126 nm, extreme ultraviolet radiation, electron beam, x-ray irradiation and combinations thereof.

Next, as shown in FIG. 4, a pattern 130 (e.g., openings) may be formed by removing a portion(s) of photoresist 122 to expose implant stopping layer 120 in any now known or later developed fashion, e.g., patterning photoresist 122, exposing it to radiation, and etching to create pattern 130. The etching may include, for example, a wet etching. Pattern 130 may be aligned with openings 132 between trench isolations 124, i.e., with the appropriate well definition pattern, such that ion implantation may occur between trench isolations 124. However, this is not necessary.

In FIG. 5, pattern 130 is transferred into implant stopping layer 120 by etching using patterned photoresist 122 to complete mask 100. In one embodiment, the etching may include RIE. For example, the transferring may include removing a portion of implant stopping layer 120 by reactive ion etching in a plasma containing one or more reactive species selected from the group consisting of fluorine (Fl), fluorocarbon, chlorine (Cl), bromine (Br), oxygen ($O_2$), carbon monoxide (CO) and carbon dioxide ($CO_2$). Other techniques, however, are also possible. Patterned photoresist 122 and patterned implant stopping layer 120 collectively have an aspect ratio of, for example, less than approximately 4.0. However, the invention is not limited to that aspect ratio. That is, they are collectively thinner than conventional bilayer photoresists structures.

Figure 6:
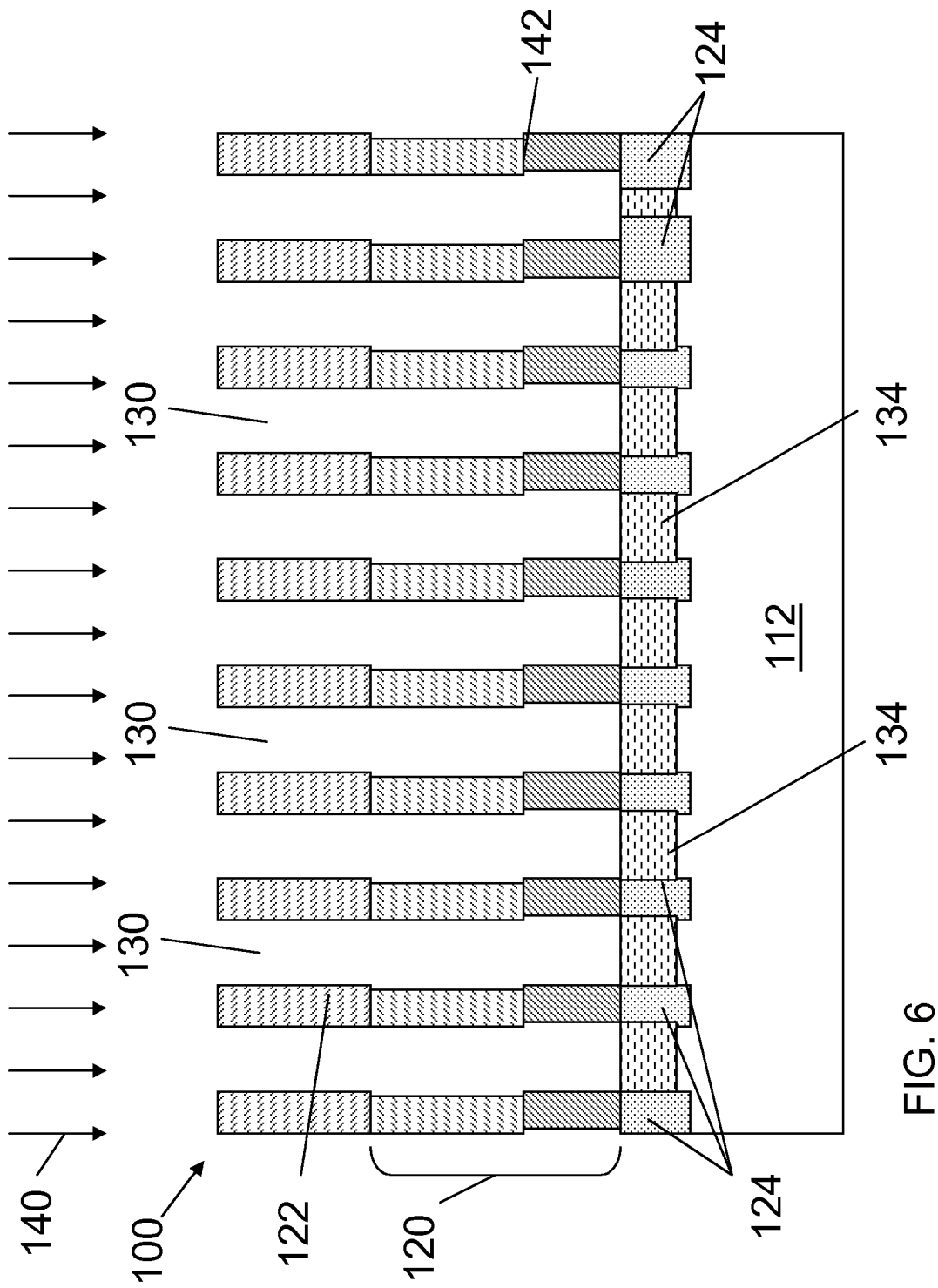
FIG. 6 shows use of the mask of FIG. 5 for implanting a substrate according to another embodiment of the invention.

In FIG. 6, an ion implant 140 is conducted using mask 100. At this stage, mask 100 includes implant stopping layer 120 over substrate 112, and photoresist 122 over implant stopping layer 120. Implant stopping layer 120 includes at least one of hydrogenated germanium carbide, nitrogenated germanium carbide, fluorinated germanium carbide and amorphous germanium carbon hydride (GeHX), where X includes carbon. As indicated, ion implantation reaches substrate 112, in regions 134 between trench isolations 124, via pattern 130 through photoresist 122 and implant stopping layer 120. However, ion implantation is stopped at a location 142 within implant stopping layer 120 above substrate 112. Implantation into mask 100 exhibits less scattering than conventional processes, which allows for reduction of a threshold voltage shift of devices subsequently generated. Implant 140 may include, for example, a well, halo, extension, deep source/drain ion implantation process. It is understood that implant stopping layer 120 and trench isolations 124 may not have identical widths. For example, the far right trench isolations 124 in FIGS. 3-7 show how trench isolations 124 may be wider. Additionally, it is understood that implant stopping layer 120 may be designed to cover some portion of substrate 112 that is not intended to be receive ion implant 140.

Figure 7:
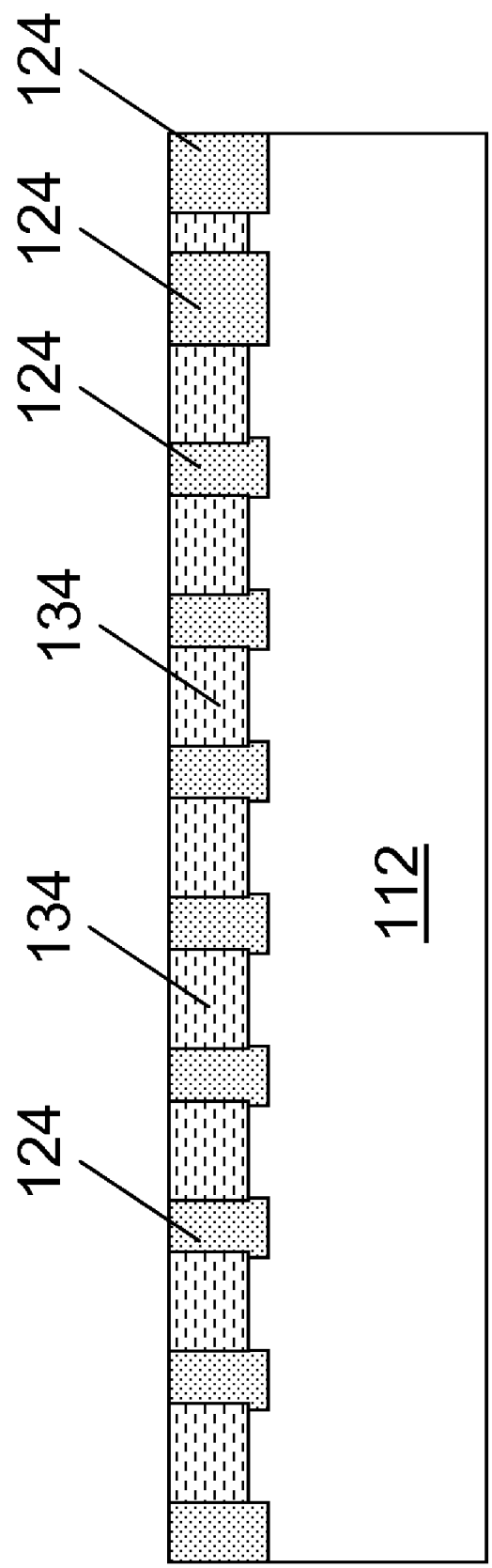
FIG. 7 shows the implanted substrate.

FIG. 7 shows a next step of removing photoresist 122 and implant stopping layer 120 after implanting using mask 100. The removing step may use any conventional processes. One advantage, however, of implant stopping layer 120 removal is that the particular chemistries used cause minimal damage to trench isolations 124. Substrate 112, as shown, may be used to generate semiconductor devices thereon in any now known or later developed fashion.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of forming a mask for implanting a substrate, the method comprising the steps of:
   depositing an implant stopping layer over the substrate, wherein the implant stopping layer includes at least one of: hydrogenated germanium carbide, nitrogenated germanium carbide, fluorinated germanium carbide, and amorphous germanium carbon hydride (GeHX), where X includes carbon, and wherein the substrate includes at least one trench isolation;
   depositing a photoresist over the implant stopping layer, the implant stopping layer having a density and a depth greater than a density and a depth of the photoresist;
   forming a pattern in the photoresist by removing a portion of the photoresist to expose the implant stopping layer; and
   transferring the pattern into the implant stopping layer by etching to form the mask, wherein the implant stopping layer pattern includes a portion of the implant stopping layer directly over and abutting the at least one trench isolation.

2. The method of claim 1, wherein the implant stopping layer depositing includes depositing using at least one of:

chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), sputtering deposition, ion beam deposition, electron beam deposition, and laser assisted deposition.

3. The method of claim 1, wherein the substrate includes at least one of: a semiconductor, a dielectric, a glass, a metal, nonmetallic conductor, magnetic material and a polymer.

4. The method of claim 1, wherein the transferring includes removing a portion of the implant stopping layer by reactive ion etching in a plasma containing one or more reactive species selected from the group consisting of fluorine (F), fluorocarbon, chlorine (Cl), bromine (Br), oxygen ($O_2$), carbon monoxide (CO) and carbon dioxide ($CO_2$).

5. The method of claim 1, wherein the implant stopping layer depositing includes depositing from a precursor including at least one of: germane, alkyl germane, alkoxy germane, acyloxy germane, aryl germane, cyclicgermanes, nitrogen, carbon, and fluorine.

6. The method of claim 1, wherein the implant stopping layer depositing includes depositing from tetramethylgermane in a reactor at a pressure of approximately 0.1 Torr to approximately 50 Torr, and the substrate at a temperature of approximately 200° C. to approximately 500° C.

7. The method of claim 1, wherein the patterned photoresist and the patterned implant stopping layer collectively have an aspect ratio of less than approximately 4.0.

8. The method of claim 1, further comprising the step of removing the photoresist and the implant stopping layer after implanting the substrate.

9. The method of claim 8, wherein the removing step does not damage the at least one trench isolation.

10. The method of claim 1, further comprising implanting the substrate, wherein the substrate further includes a plurality of trench isolations, the implanting of the substrate including ion implanting in at least one region of the substrate between the plurality of trench isolations.

11. The method of claim 10, wherein the implant stopping layer pattern prevents the ion implanting in at least one region of the substrate below at least one of the plurality of trench isolations.

12. A method of implanting a substrate, the method comprising the steps of:

depositing an implant stopping layer over the substrate, the substrate including at least one trench isolation, wherein the implant stopping layer includes at least one of: hydrogenated germanium carbide, nitrogenated germanium carbide, fluorinated germanium carbide, and amorphous germanium carbon hydride (GeHX), where X includes carbon;

depositing a photoresist over the implant stopping layer, the implant stopping layer having a density and a depth greater than a density and a depth of the photoresist;

forming a pattern in the photoresist by removing a portion of the photoresist to expose the implant stopping layer;

transferring the pattern into the implant stopping layer by etching to form the mask, wherein the implant stopping layer pattern includes a portion of the implant stopping layer directly over and abutting the at least one trench isolation; and implanting the substrate.

13. The method of claim 12, wherein the transferring includes removing a portion of the implant stopping layer by reactive ion etching in a plasma containing one or more reactive species selected from the group consisting of fluorine (F), fluorocarbon, chlorine (Cl), bromine (Br), oxygen ($O_2$), carbon monoxide (CO) and carbon dioxide ($CO_2$).

14. The method of claim 12, wherein the implant stopping layer depositing includes depositing from a precursor including at least one of: germane, alkyl germane, alkoxy germane, acyloxy germane, aryl germane, cyclicgermanes, nitrogen, carbon, and fluorine.

15. The method of claim 12, wherein the implant stopping layer depositing includes depositing from tetramethylgermane in a reactor at a pressure of approximately 0.1 Torr to approximately 50 Torr, and the substrate at a temperature of approximately 200° C. to approximately 500° C.

16. The method of claim 12, wherein the substrate further includes a plurality of trench isolations, and wherein the implanting of the substrate includes ion implanting in at least one region of the substrate between the plurality of trench isolations.

17. The method of claim 16, wherein the implant stopping layer pattern prevents the ion implanting in at least one region of the substrate below at least one of the plurality of trench isolations.

* * * * *